(12) United States Patent
Tanaka et al.

(10) Patent No.: US 8,796,850 B2
(45) Date of Patent: Aug. 5, 2014

(54) WIRING CONNECTION METHOD AND FUNCTIONAL DEVICE

(75) Inventors: Shuji Tanaka, Miyagi (JP); Masayoshi Esashi, Miyagi (JP); Sakae Matsuzaki, Miyagi (JP); Mamoru Mori, Ishikawa (JP)

(73) Assignee: Tohoku University, Sendai-shi, Miyagi (JP)

( * ) Notice: Subject to any disclaimer, the term of this patent is extended or adjusted under 35 U.S.C. 154(b) by 0 days.

(21) Appl. No.: 13/393,577

(22) PCT Filed: Sep. 1, 2010

(86) PCT No.: PCT/JP2010/064880
§ 371 (c)(1),
(2), (4) Date: May 10, 2012

(87) PCT Pub. No.: WO2011/027762
PCT Pub. Date: Mar. 10, 2011

(65) Prior Publication Data
US 2012/0217638 A1    Aug. 30, 2012

(30) Foreign Application Priority Data

Sep. 1, 2009    (JP) ................................. 2009-202078

(51) Int. Cl.
*H01L 23/48*    (2006.01)
*H01L 23/00*    (2006.01)

(52) U.S. Cl.
CPC ...................................... *H01L 24/16* (2013.01)
USPC .................................. 257/741; 257/E21.567

(58) Field of Classification Search
CPC ........... H01L 2224/32225; H01L 2224/48227; H01L 2224/73265; H01L 2924/00
See application file for complete search history.

(56) References Cited

U.S. PATENT DOCUMENTS

2007/0262440 A1    11/2007    Asaoka
2008/0029864 A1    2/2008    Pyo et al.

FOREIGN PATENT DOCUMENTS

| JP | 2005-277059 A | 10/2005 |
| JP | 2007-305856 A | 11/2007 |
| JP | 2007-331099 A | 12/2007 |

OTHER PUBLICATIONS

International Search Report of PCT/JP2010/064880, mailing date Oct. 5, 2010.
Liu, Yongxun et al., "A Thermomechanical Relay with Microspring Contact Array", IEEE 14th International Conference on Micro Electro Mechanical Systems, Jan. 2001, pp. 220-223, cited in specification.
Welch III, Warren C. et al., "Gold-Indium Transient Liquid Phase (TLP) Wafer Bonding for MEMS Vacuum Packaging", IEEE 21st International Conference on Micro Electric Mechanical Systems, Jan. 2008, pp. 806-809, cited in specification.

*Primary Examiner* — Tony Tran
(74) *Attorney, Agent, or Firm* — Westerman, Hattori, Daniels & Adrian, LLP

(57) ABSTRACT

By forming a metal layer 14 on at least one of a connecting electrode 12 of a first substrate 10 and a connecting electrode 17 of a second substrate 15, placing the first substrate 10 and the second substrate 15 together in order that the connecting electrode 12 and the connecting electrode 17 face opposite to each other via the metal layer 14, increasing temperature up to anodic bonding temperature, and applying DC voltage between the first substrate 10 and the second substrate 15 while maintaining that temperature, the first substrate 10 and the second substrate 15 are anodically bonded, and at the same time by melting the metal layer 14, the connecting electrode 12 and the connecting electrode 17 are electrically connected. The method achieves anodic bonding of substrates with high yield and at the same time establishes wiring connection, effective for packaging.

6 Claims, 16 Drawing Sheets

Fig. 2
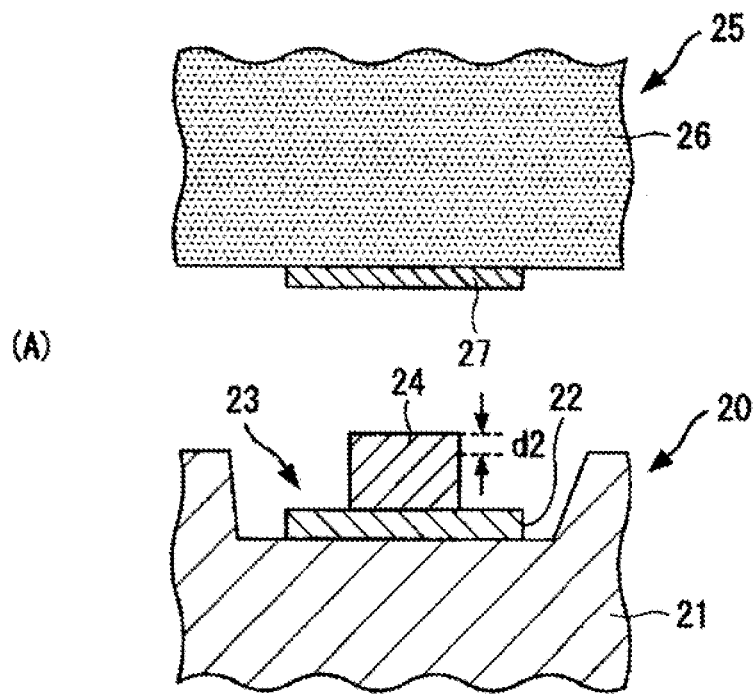
(A)
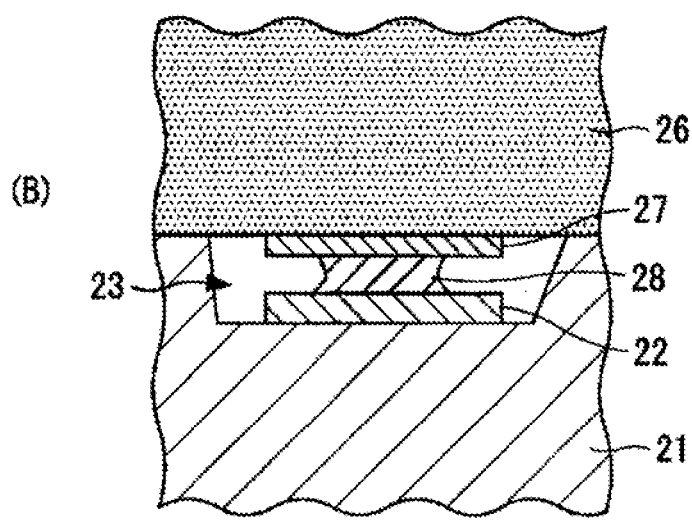
(B)

Fig. 4
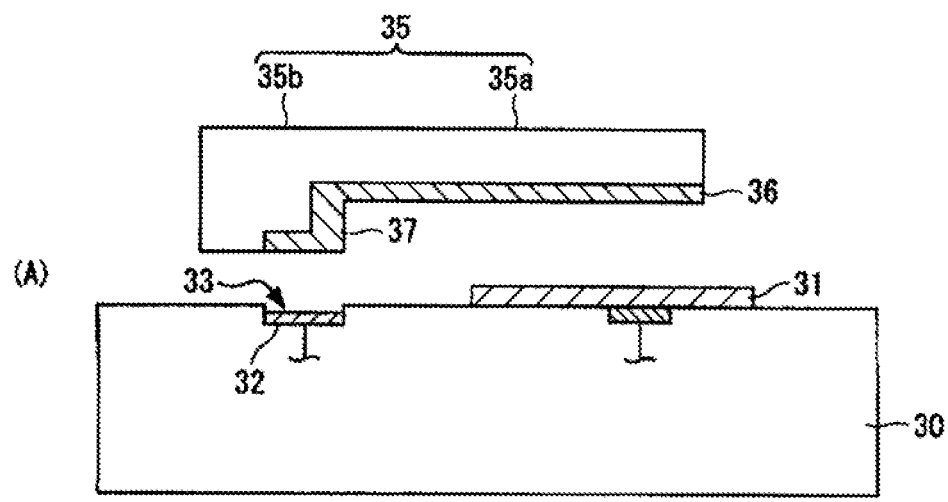
(A)
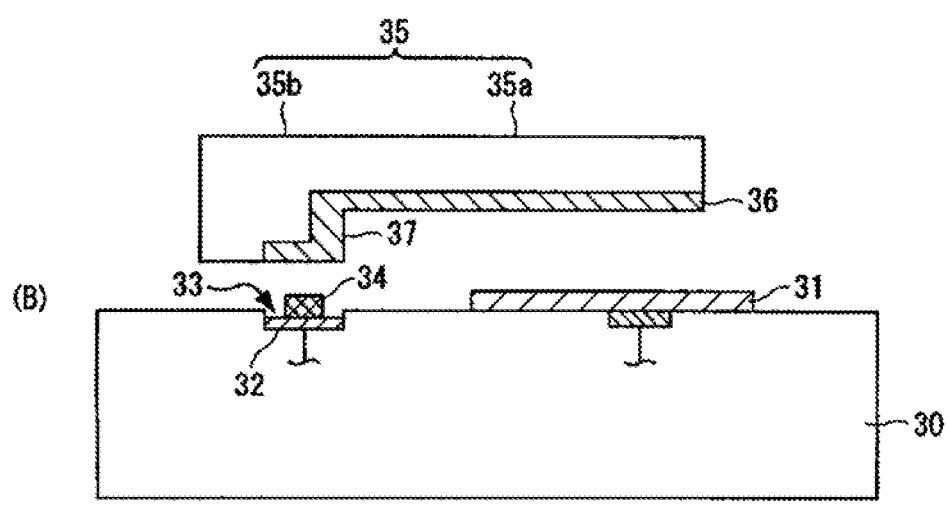
(B)

Fig. 9
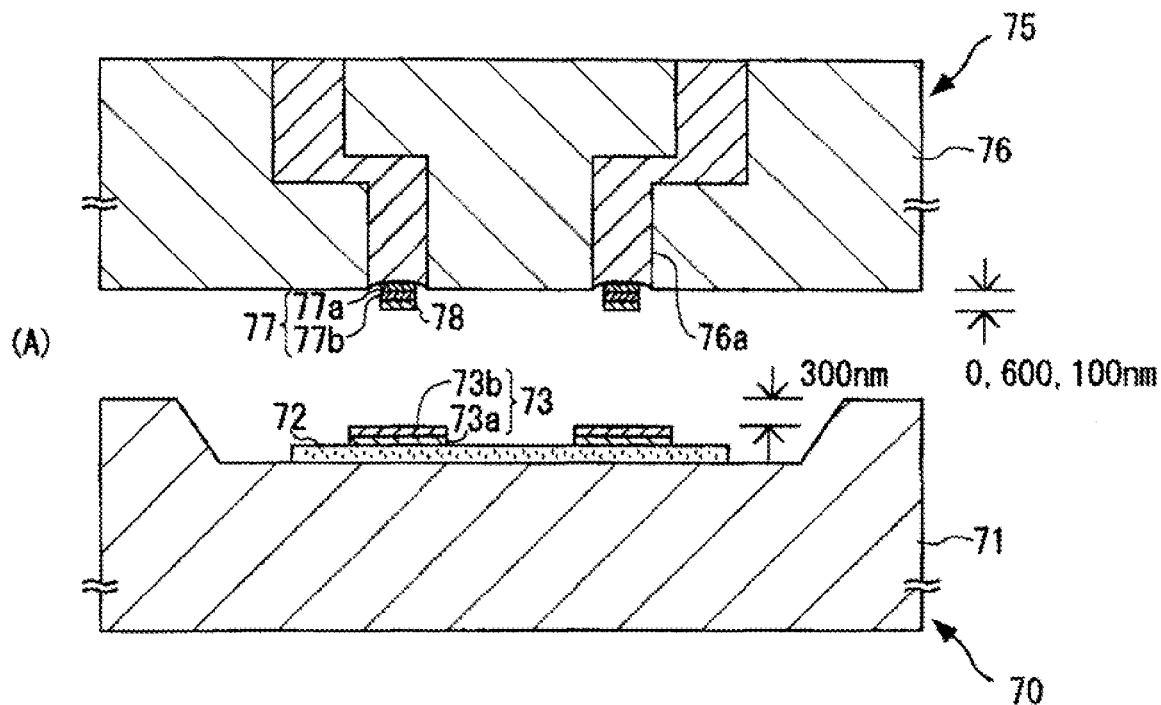
(A)
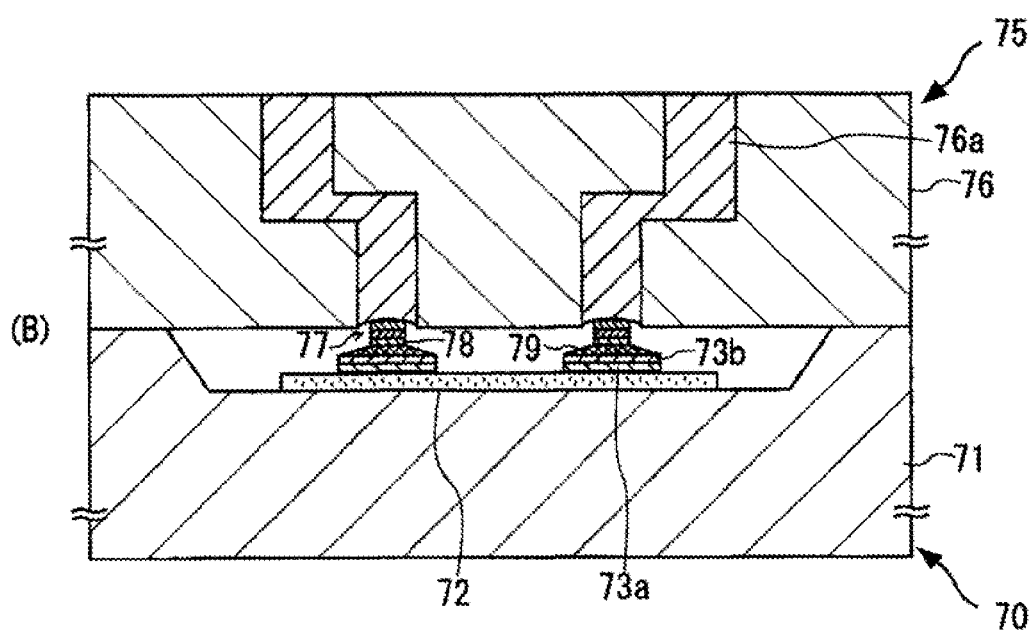
(B)

WIRING CONNECTION METHOD AND FUNCTIONAL DEVICE

TECHNICAL FIELD

The present invention relates to a wiring connection method allowing electrical interconnection to be simultaneously established with anodic bonding between substrates, and a functional device manufactured by the wiring connection method.

BACKGROUND ART

Electronic circuits and MEMS structures MEMS and similar microdevices are often formed by bonding and sealing a first substrate, on which various electronic circuits and micro electro mechanical system (MEMS) structures are formed, with a second substrate such as a glass substrate. Specifically, by performing microfabrication such as a thin film formation process and an etching process, various electronic circuits and MEMS are formed on each of a semiconductor substrate and a glass substrate. Negative and positive voltages are then applied to the glass and semiconductor substrate, respectively, while the substrates attached to each other are heated, and finally they are bonded by covalent bonding. Such bonding is called anodic bonding, and is widely used for MEMS manufacturing and packaging.

In Non-patent Literature 1, by anodically bonding a first substrate, on which a thermally-actuated high-frequency MEMS switching device is formed, and a second substrate, namely a glass substrate having through wiring, the high-frequency MEMS switching device is vacuum-sealed. Metallic thin films both on the high-frequency MEMS switching device and on the partially-etched second substrate are made contact together, and electrical connection between the substrates is established.

Meanwhile, Patent Literature 1 discloses a connection method, where thermo-compression bonding rather than anodic bonding is performed for semiconductor chips, and through-substrate interconnection is established by soldering.

CITATION LIST

Patent Literature

Patent Literature 1: JP2005-277059A

Non-Patent Literature

Non-patent Literature 1: Yongxun Liu et al., A THERMO-MECHANICAL RELAY WITH MICROSPRING CONTACT ARRAY, IEEE 14th International Conference on Micro Electro Mechanical Systems (MEMS 2001). Interlaken, Switzerland, Jan. 21-25, 2001, pp. 220-223

Non-patent Literature 2: Warren C. Welch III and Khalil Najafi, GOLD-INDIUM TRANSIENT LIQUID PHASE (TLP) WAFER BONDING FOR MEMS VACUUM PACKAGING, IEEE 21st International Conference on Micro Electro Mechanical Systems (MEMS 2008), Tucson, Ariz., USA, Jan. 13-17, 2008, pp. 806-809

SUMMARY OF INVENTION

Technical Problem

FIGS. 13 to 16 illustrate a problem to be solved by the present invention. Establishing electrical connection simultaneously with anodic bonding of two substrates is investigated here.

As shown in FIG. 13, for example, when metal layers 101a, 102a are formed on a glass substrate 101 and a Si (silicon) substrate 102, respectively, as they protrude from their respective surface, the metal layers 101a, 102a contact each other, but the surface of the glass substrate and that of Si substrate on which the metal layers 101a, 102a are not formed do not contact each other. Consequently, the glass substrate 101 and the Si substrate 102 cannot be bonded anodically at least in areas surrounding the metal layers 101a, 102a.

On the contrary, as shown in FIG. 14, a case where a metal layer 101a is formed on a glass substrate 101, protruding from its surface 101b, a recessed area 102c is formed on the opposing surface 102b of the Si substrate 102, and a metal layer 102a is formed in the recessed area 102c, is assumed. In this case, if the height of the metal layer 102a is low, the metal layers 101a, 102a cannot be connected electrically although the glass substrate 101 and the Si substrate 102 can be bonded anodically.

To prevent a case as shown in FIG. 13 from occurring, in the glass substrate 101 and the Si substrate 102, the height of the surfaces where the metal layers 101a, 102a are not formed should be equal to the height of the surface of the metal layers 101a, 102a, and this leads to need to precisely adjust the thickness of each metal layer 101a, 102a. To prevent a case as shown in FIG. 14 from occurring, it is necessary to adjust the thickness of the metal layers 101a and 102a formed on the glass substrate 101 and the Si substrate 102, respectively. As described above, to establish electrical connection between the metal layers on the substrates simultaneously with the anodic bonding of the substrates, the thickness of each metal layer must be adjusted individually, which decreases yield.

By the way, when bonding a substrate in which wiring penetrates in the thickness direction of the substrate (hereinafter referred to as a "substrate with through wiring") 103 as shown in FIG. 15 and another substrate 104, the substrate with through wiring 103 is polished in advance to obtain a surface appropriate for bonding. However, as shown in FIG. 16, there is a case where the surface of the through wiring 103a may be recessed slightly from the surface of the substrate due to the difference in polishing characteristics between the wiring material and the substrate material. In such a case, to connect the through wiring 103a and a metal layer 104a formed on the other substrate 104, and at the same time anodically bond the substrate with through wiring 103 and the other substrate 104, it is necessary to form another metal layer (not shown) either on the surface of the through wiring or on the metal layer 104a to be connected to the through wiring, thereby filling the recess 103b. In this case also, it is necessary to precisely adjust and control the thickness of the metal layer. The above problem is severe especially when the depth of the recesses on the surface of the through wiring 103a cannot be made uniform after polishing the surface of the substrate with through wiring 103, because the yield decreases.

In view of the above problems, one of the objectives of the present invention is to provide a method to simultaneously establish both wiring connection and anodic bonding between substrates at high yield, and another objective is to provide functional devices manufactured by this wiring connection method.

Solution to Problem

To achieve the first objective described above, the wiring connection method of the present invention includes: forming a metal layer on at least one of a connecting electrode of a first substrate and a connecting electrode of a second substrate;

placing the first substrate and the second substrate together in order that the connecting electrode of the first substrate and the connecting electrode of the second substrate face to each other via the metal layer; increasing temperature to anodic bonding temperature; applying DC voltage to the first substrate and the second substrate while maintaining that temperature to anodically bond the first substrate and the second substrate and to melt the metal layer, and whereby the connecting electrode of the first substrate and the connecting electrode of the second substrate are electrically connected.

In the wiring connection method described above, it is particularly favorable that the connecting electrode of the first substrate and the connecting electrode of the second substrate do not contact but form a space when the first substrate and the second substrate are placed together in a stage before the metal layer is formed, and the metal layer protrudes either from the first substrate or from the second substrate, on which the metal layer is formed, and has a size equal to or smaller than the volume of the space.

To achieve the other objective described above, a functional device of the present invention is characterized by that a first substrate and a second substrate anodically bonded to each other, wherein the first substrate and the second substrate are electrically connected via a connecting wiring part made of at least an intermetallic compound or at least an alloy, and the connecting wiring part does not melt at the melting temperature of the metal layer as a single body or lower.

Advantageous Effects of Invention

According to the present invention, a metal layer is formed at the connecting electrode of either the first substrate or the second substrate in advance, the first substrate and the second substrate are placed together, and DC voltage is applied to the first substrate and the second substrate at the anodic bonding temperature. Consequently, the metal layer melts at the anodic bonding temperature, thus electrically connecting the connecting electrodes and anodically bonding the first substrate and the second substrate. In addition, the anodic bonding simultaneously allows electrical wiring of the first substrate and the second substrate to be installed. With the functional device manufactured in this way, since the connecting wiring part is made of an intermetallic compound and/or alloy at least partially, electrical connection can be made without fail, which increases yield. In addition, with a favorable wiring connection method, since the thickness of the metal layer need not be adjusted or controlled precisely, the functional device can be manufactured efficiently.

BRIEF DESCRIPTION OF DRAWINGS

FIG. 2 is a chart illustrating another process of wiring connection method according to an embodiment of the present invention.

FIG. 4 (A) is a diagram illustrating an LTCC substrate or glass substrate and a MEMS substrate provided for manufacturing the functional device shown in FIG. 3, and FIG. 4 (B) is a diagram illustrating the state of the LTCC substrate or glass substrate and the MEMS substrate before they undergo anodic bonding.

FIG. 9 is a chart illustrating a process of wiring connection method used in Examples 1 and 2 and Comparative Example.

Figure 1:
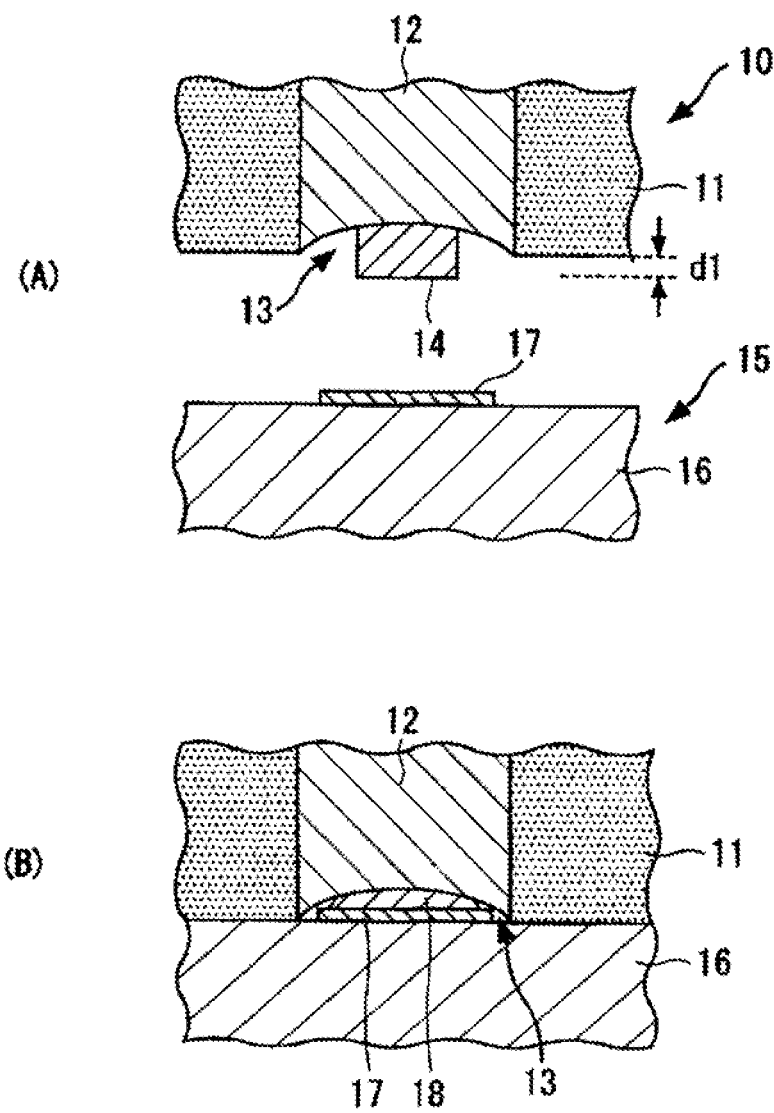
FIG. 1 is a chart illustrating a process of wiring connection method according to an embodiment of the present invention.

| Reference Sign List | |
|---|---|
| 1, 2, 3: | Functional device |
| 10: | First substrate (LTCC substrate) |
| 11, 26: | Insulating material |
| 12, 17, 22, 27, 32, 37: | Connecting electrode |
| 13: | Space |
| 14, 24, 34: | Metal layer |
| 15: | Second substrate (MEMS substrate) |
| 16, 21: | Si substrate |
| 18, 28, 38: | Connecting wiring part |
| 20: | First substrate (MEMS substrate) |
| 23: | Recessed area |
| 25: | Second substrate (glass substrate) |
| 30: | LTCC substrate or glass substrate |
| 31, 36: | Electrode |
| 33: | Recess |
| 35: | MEMS substrate |
| 35a: | Movable part |
| 35b: | Fixed part |
| 40: | MEMS substrate |
| 41: | MEMS structure |
| 41a: | Movable part |
| 41b: | Fixed part |
| 42: | First electrode |
| 43: | Second electrode |
| 44: | Recessed area |
| 45: | LTCC substrate |
| 46: | First lower electrode |
| 47: | Second lower electrode |
| 48: | First upper electrode |
| 49: | Second upper electrode |
| 53, 54: | Metal layer |
| 50: | Housing part |
| 51, 52, 67: | Connecting wiring part |
| 55, 56: | Space |
| 60: | LTCC substrate |
| 61, 66: | Connecting electrode |
| 62: | Space |
| 63: | Metal layer |
| 65A, 65B, 65C: | Chip |
| 67: | Connecting wiring part |
| 70: | First substrate |

Reference Sign List

| | |
|---|---|
| 71: | Si substrate |
| 72: | Oxide film |
| 73: | Connecting electrode |
| 73a: | Ti layer |
| 73b: | Cu layer |
| 75: | Second substrate |
| 76: | LTCC substrate |
| 76a: | Through wiring |
| 77: | Connecting electrode |
| 77a: | Cr layer |
| 77b: | Cu layer |
| 78: | Metal layer |
| 79: | Connecting wiring part |

DESCRIPTION OF EMBODIMENTS

Some embodiments of the present invention will hereinafter be described by referring to the drawings, but the embodiments can be modified as required within the range described in the scope of claims.

FIG. 1 is a chart illustrating a process of a wiring connection method according to an embodiment of the present invention. A first substrate 10 and a second substrate 15 to be anodically bonded are prepared. The first substrate 10 and the second substrate 15 respectively have a connecting electrode 12, 17 on a surface facing opposite to each other. In the example shown, the first substrate 10 is an LTCC substrate where wiring as a connecting electrode 12 penetrates an insulating material 11. The second substrate 15 is a Si substrate 16 equipped with a MEMS structure (not shown) and an electrode pad as a connecting electrode 17 formed on a surface. Under this electrode pad, an insulating layer (not shown) is formed as required. In this state, it is only necessary to form a small space 13 when the first substrate 10 and the second substrate 15 are placed together. Specifically, it is only necessary to ensure that the through wiring as the connecting electrode 12 is slightly recessed from the anodic bonding surface. For example, as shown in the figure, if the first substrate 10 is a substrate with through wiring, a recess formed by polishing may be used, on condition that the recess is slightly dented from the anodic bonding surface.

Next, a metal layer 14 is formed in specified thickness on the connecting electrode 12 of either the first substrate 10 or the second substrate 15, of the first substrate 10 in the example shown in FIG. 1. In this case, the metal layer 14 is formed with a metal that melts at the temperature of anodic bonding or lower. The metal layer 14 is thick enough to protrude from the anodic bonding surface by distance d1. The thickness must ensure that the volume of the metal layer 14 is the same as or smaller than the volume of the space 13. The reason for this is that as described later, as a result of melting of the metal layer 14, the height of the metal layer 14 decreases to have the same height as the space 13, and the metallic material of the amount equivalent to the decrease in height spreads in a void of the space 13 where the metal layer 14 is not formed, or fills the entire space 13. If the connecting electrode 12 is through wiring, it is only necessary to form a metallic pad whose bottom surface is smaller than the curved surface of the through wiring and whose thickness is larger than the height of the space 13. FIG. 1 (A) shows this state.

The first substrate 10 and the second substrate 15 are then placed together in order that the connecting electrodes 12, 17 of the first substrate 10 and the second substrate 15 are overlapped with each other via the metal layer 14, temperature is increased to a level allowing the metal layer 14 to melt or higher, and then DC voltage is applied between the first substrate 10 and the second substrate 15 while anodic bonding temperature is maintained. Namely, when the first substrate 10 and the second substrate 15 are anodically bonded, the metal layer 14 melts during that process, the molten metal flows within the space 13 between the connecting electrodes 12, 17, connecting wiring part 18 is formed between the connecting electrode 12 and the connecting electrode 17. As a result, electrical connection is established.

In this case, the molten metal causes the electrode pad as connecting electrode 17 to become wet easily, and the insulating material 11 of the first substrate 10 and the Si substrate 16 of the second substrate 15 are hardly wetted. As described earlier, since the volume of the metal layer 14 is made to be smaller than the space between the connecting electrodes 12, 17, it is unlikely that the molten metal leaks into the interface between the insulating material 11 and the Si substrate 16.

When the first substrate 10 and the second substrate 15 are anodically bonded by the process described above, electrical connection can also be established.

Furthermore, as the metal layer 14 to be formed on the connecting electrode 12, metallic materials that melt at the time of anodic bonding and then form at least an intermetallic compound and/or at least an alloy with the metal forming the electric pad as the other connecting electrode 17 may be used. Such metallic materials have a property that they do not melt at temperatures the same as or lower than the anodic bonding temperature, when the intermetallic compound or alloy is formed by anodic bonding. The combinations between such metallic materials and other metallic materials include Sn/Cu, Sn/Ag, In/Ag, Su/Au, In/Au, and Sn/Ni (Non-patent Literature 2). The elements before the diagonal "/" represent the type of the metallic material, and the elements after the diagonal "/" represent the type of the other metal, the type of metallic material of the connecting electrode 17 in the example shown in FIG. 1, for example. As a result of selecting a combination between a metallic material and another metal, even if temperature is increased up to the anodic bonding temperature, the intermetallic compound or alloy constituting the connecting wiring part 18 does not melt.

FIG. 2 is a chart illustrating another process of wiring connection method according to an embodiment of the present invention. A first substrate 20 and a second substrate 25 for anodic bonding are prepared. The first substrate 20 and the second substrate 25 respectively have a connecting electrode 22, 27 on the surface facing opposite to each other. In the example shown in the figure, the first substrate 20 is equipped with a MEMS structure (not shown) on a Si substrate 21, and an electrode pad is formed on the opposing surface as a connecting electrode 22. The connecting electrode 22 is formed in a recessed area 23 created by partially etching the Si substrate 21. Under this connecting electrode 22, an insulating layer is provided as required (not shown). The second substrate 25 is a glass substrate formed by installing a connecting electrode 27 on an insulating material 26, for example. In this state, even if the first substrate 20 and the second substrate 25 are placed together, the connecting electrodes 22, 27 do not contact each other but retain a given distance.

A metal layer 24 in a given thickness is then formed on the connecting electrode 22 of either the first substrate 20 or the second substrate 25, of the first substrate 20 in FIG. 2. In this case, the metal layer 24 is formed with a metal that melts at the anodic bonding temperature or lower. The metal layer 24 has a thickness larger than the given distance described above, and the thickness must ensure that the volume of the metal layer 24 remains the same as or smaller than the volume of the recessed area 23. The reason for this is that as described later, as a result of melting of the metal layer 24, the height of the metal layer 24 decreases to have the same height as the given space, and the metallic material of the amount equivalent to the decrease in height spreads in a void of the space where the metal layer 24 is not formed. When a connecting electrode 22 is formed within the recessed area 23 of the first substrate 20 as shown in the figure, it is only necessary to ensure that the metal layer 24 is smaller than the size of the surface of the connecting electrode 22, and that the metallic pad is formed protruding from the anodic bonding surface by distance of d2.

The first substrate 20 and the second substrate 25 are then placed together in order that the connecting electrodes 22, 27 of the first substrate 20 and the second substrate 25 overlap each other via the metal layer 24, temperature is increased to a level allowing the metal layer 24 to melt or higher, and then DC voltage is applied between the first substrate 20 and the second substrate 25 while the anodic bonding temperature is maintained. In other words, when the first substrate 20 and the second substrate 25 are anodically bonded, the metal layer 24 melts during that process, and the molten metal spreads between the connecting electrodes 22, 27 to form connecting wiring part 28, whereby establishing electrical connection.

By undergoing the process described above, the first substrate 20 and the second substrate 25 are bonded anodically, and at the same time electrical connection can be established. Furthermore, the metal layer 24 to be formed on the connecting electrode 22 may be formed using a metallic material that melts at the time of anodic bonding and forms at least an intermetallic compound and/or at least an alloy with the metal constituting the other connecting electrode 27. In this case, the intermetallic compound or alloy does not melt at temperatures the same as or lower than the anodic bonding temperature.

Figure 3:
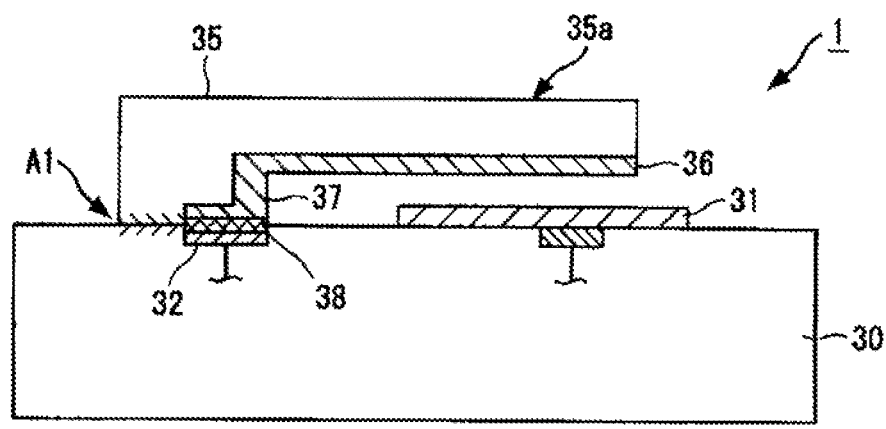
FIG. 3 is a structural diagram illustrating a functional device according to an embodiment of the present invention.

A functional device that can be manufactured by the wiring connection method according to the embodiment of the present invention will hereinafter be described. FIG. 3 is a structural diagram illustrating a functional device according to an embodiment of the present invention. As shown in FIG. 3, a functional device 1 is formed by anodically bonding an LTCC substrate equipped with various elements and through wiring or a glass substrate on which thin film wiring, etc. are formed (hereinafter referred to as "LTCC substrate or glass substrate") 30 as the first substrate, and a MEMS substrate 35 as the second substrate. This functional device 1 has a switching circuit by allowing the electrode 36 of the movable part 35a of the MEMS substrate 35 to contact the electrode 31 of the LTCC substrate or glass substrate 30.

FIG. 4 (A) is a chart illustrating the LTCC substrate or glass substrate 30 and the MEMS substrate 35 provided to manufacture the functional device 1 shown in FIG. 3, and FIG. 4 (B) is a chart illustrating the state before the LTCC substrate or glass substrate 30 and the MEMS substrate 35 undergo anodic bonding. The MEMS substrate 35 is supported by a supporting substrate not shown. As shown in FIG. 4 (A), the LTCC substrate or glass substrate 30 has an electrode 31 and a connecting electrode 32 on the surface. The MEMS substrate 35 includes a movable part 35a and a fixed part 35b that roughly form a roughly L-shaped cross-sectional area. The MEMS substrate 35 has an electrode 36 on the surface facing to the LTCC substrate or glass substrate 30. One end of the electrode 36 is connected to the connecting electrode 37. The connecting electrode 37 is provided along the bottom face of the fixed part 35b.

The wiring connection method for manufacturing this functional device 1 will be described below. As shown in FIG. 4 (A), an LTCC substrate or glass substrate 30 and a MEMS substrate 35 are prepared. The LTCC substrate or glass substrate 30 has a connecting electrode 32 and an electrode 31 on each surface. The connecting electrode 32 in the LTCC substrate or glass substrate 30 is formed in a recess 33 on the surface, and the surface of the connecting electrode 32 is not at the same height as the anodic bonding surface of the LTCC substrate or glass substrate 30. As shown in FIG. 4 (B), a metal layer 34 is then formed on the connecting electrode 32. At this time, the metal layer 34 does not fill the recess 33. Namely, the metal layer 34 is formed in order to be in a shape higher than the distance between the connecting electrodes 32, 37 formed when the LTCC substrate or glass substrate 30 and the MEMS substrate 35 are placed together, and in order that the volume of the metal layer 34 is smaller than the space of the recess 33. The thickness of the metal layer 34 is larger than the gap between the connecting electrode 32 and the connecting electrode 37 generated when the LTCC substrate or glass substrate 30 and the MEMS substrate 35 shown in FIG. 4 (A) are placed together.

As shown in FIG. 4 (B), the LTCC substrate or glass substrate 30 and the MEMS substrate 35 are then placed together in order that the connecting electrode 32 of the LTCC substrate or glass substrate 30 and the connecting electrode 37 of the MEMS substrate 35 face opposite to each other. The temperature is then increased, anodic bonding temperature is maintained, and voltage is applied in order that the MEMS substrate 35 is higher voltage than the LTCC substrate or glass substrate 30. Consequently, the metal layer 34 melts to form an alloy or intermetallic compound together with the connecting electrode 37, thus becoming a connecting wiring part 38. This connecting wiring part 38 allows the connecting electrode 32 and the connecting electrode 37 to be electrically connected, and at the same time, allows the opposing face of the LTCC substrate or glass substrate 30 and that of the MEMS substrate 35 to contact and be bonded. The area shown as A1 in FIG. 3 represents the surface having been anodically bonded.

Figure 5:
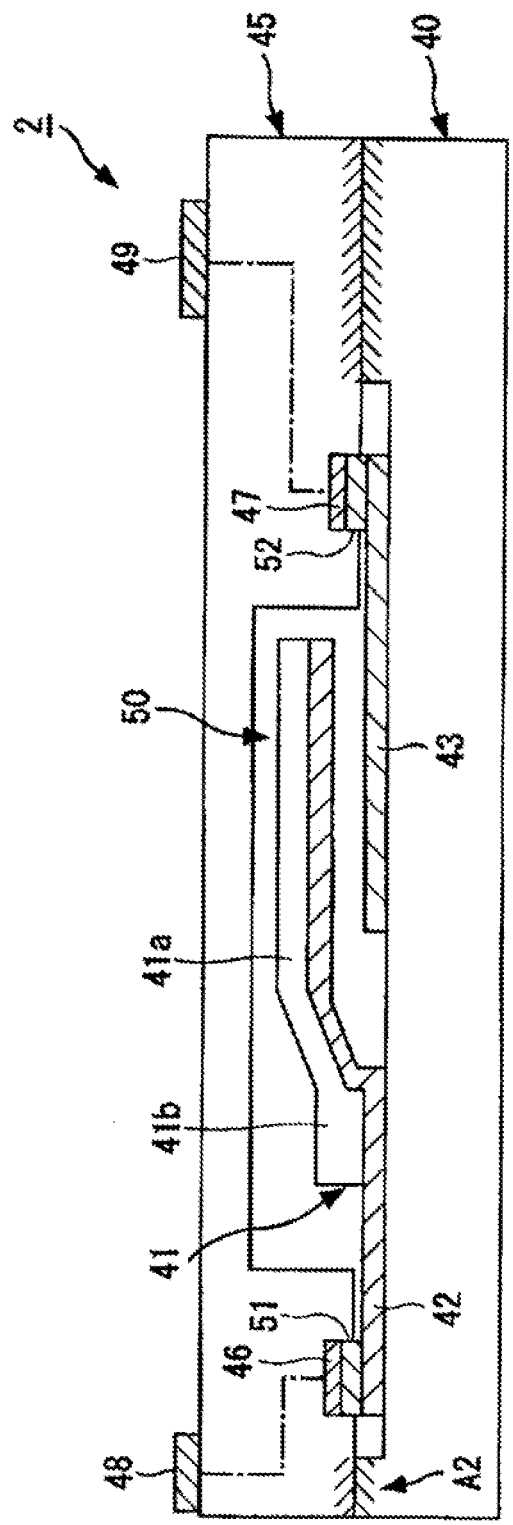
FIG. 5 is a chart illustrating another functional device according to an embodiment of the present invention.
Figure 6:
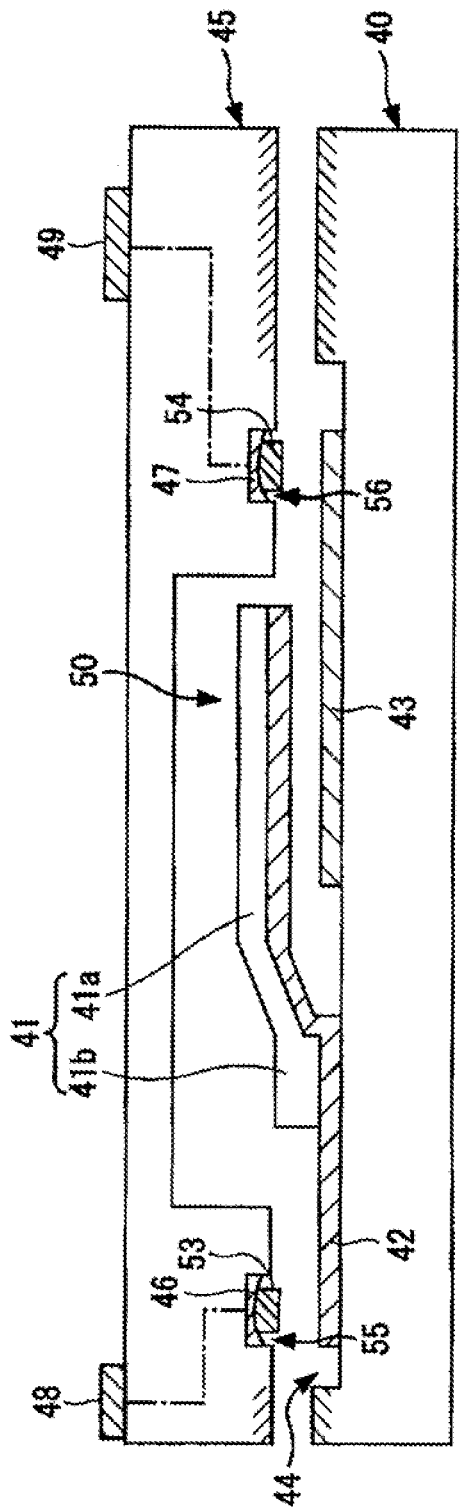
FIG. 6 is a chart illustrating the state of two substrates before they undergo anodic bonding to manufacture the functional device shown in FIG. 5.

FIG. 5 illustrates a functional device according to the embodiment of the present invention. FIG. 6 is a chart illustrating the state of two substrates before they undergo anodic bonding to manufacture the functional device shown in FIG. 5. As shown in FIG. 5, the functional device 2 is manufactured by anodically bonding a MEMS substrate 40 equipped with a MEMS structure 41 as a first substrate and an LTCC substrate 45 as a second substrate. Thin film formation, etching, removal of a sacrifice layer, etc. are performed repeatedly in a specified order on a Si substrate to build the MEMS structure 41 to make the MEMS substrate 40. The MEMS substrate 40 has a flat-shaped first electrode 42 and a second electrode 43 as well as the cantilevered MEMS structure 41. On the surface of the MEMS substrate 40, a recessed area 44 is formed, the first electrode 42 and the second electrode 43 are formed in the recessed area 44, and the MEMS structure 41 is formed on the first electrode 42. Under the first electrode 42 and the second electrode 43, an insulating layer is formed (not shown). Details of the MEMS structure 41 are as follows: a fixed part 41b is formed on the first electrode 42, and a movable part 41a is formed at the tip of the fixed part 41b, facing opposite to the second electrode 43. The MEMS structure 41 is outstanding from the surface of the MEMS substrate 40 other than the recessed area 44, namely the anodic bonding surface. The LTCC substrate 45 is formed by connecting a first lower electrode 46, second lower electrode 47, first upper electrode 48, and second upper electrode 49 by multilayer interconnection and through wiring, namely, by laminating printed wiring on a substrate having undergone through wiring for example, and then firing it while applying pressure from top and bottom for bonding.

In this embodiment, the first electrode 42 of the MEMS substrate 40 and the first lower electrode 46 of the LTCC substrate 45 react with the material of the metal layer 53. As a result, an alloy or intermetallic compound is formed, constituting a connecting wiring part 51. The second electrode 43 of the MEMS substrate 40 and the second lower electrode 47 of the LTCC substrate 45 react with the material of the metal layer 54. As a result, an alloy or intermetallic compound is formed, constituting a connecting wiring part 52.

With this functional device 2, the MEMS structure 41 of the MEMS substrate 40 is hermetically packaged into the LTCC substrate 45, the first electrode 42 and the second electrode 43 of the MEMS substrate 40 are respectively electrically connected to the first lower electrode 46 and the second lower electrode 47 of the LTCC substrate via the connecting wiring parts 51, 52, and the bottom face of the LTCC substrate 45 and the upper face of the MEMS substrate 40 are anodically bonded. The anodically-bonded interface is partially shown with hatching A2. As shown in the figure, since the MEMS structure 41 is separated from the first electrode 43 of the MEMS substrate 40, the MEMS structure 41 is bent and deformed by Joule heat, etc. and as a result the MEMS structure 41 contacts the first electrode 43 of the MEMS substrate 40. Whether such contact is occurring or not can be judged based on the output or non-output of electrical signals from the first and the second upper electrodes 48, 49 installed on the upper surface of the LTCC substrate 45. Or, as a result of applying acceleration to the functional device 2, the MEMS structure 41 may be bent and deformed, changing the distance from the first electrode 43 of the MEMS substrate 40. This change in the distance can be measured from the first and the second upper electrodes 48, 49 installed on the upper surface of the LTCC substrate 45 as a change in electrostatic capacitance.

The wiring connection method for manufacturing this functional device 2 will be described below. An LTCC substrate 45 and a MEMS substrate 40 are prepared. The LTCC substrate 45 has a through wiring structure and/or multilayer interconnection structure, and has a first lower electrode 46 as a first connecting electrode and a second lower electrode 47 as a second connecting electrode on the bottom surface. The first and the second lower electrodes 46, 47 of the LTCC substrate 45 are respectively installed in depressed space 55, 56, and the surface of the first and the second lower electrodes 46, 47 is not at the same height as the anodic bonding surface of the LTCC substrate 45. As shown in FIG. 6, metal layers 53, 54 are respectively provided to the first and the second lower electrodes 46, 47 as the first and the second connecting wiring part. At this time, it is necessary that the metal layers 53, 54 do not fill the respective recessed space 55, 56, their thickness is larger than the gap between connecting electrodes generated when the LTCC substrate 45 and the MEMS substrate 40 are placed together in a state where the metal layers 53, 54 shown in FIG. 6 are not installed, and the volume of the metal layer 53, 54 is smaller than the recessed space 55, 56. Namely, the thickness of the metal layers 53, 54 should be larger than the distance between the lower electrodes 46, 47 and the first and the second electrodes 42, 43 generated when the LTCC substrate 45 and the MEMS substrate 40 are placed together.

The LTCC substrate 45 and the MEMS substrate 40 are then placed together in order that the first and the second lower electrodes 46, 47 as the first and the second connecting electrodes of the LTCC substrate 45 respectively face opposite to the first and the second electrodes 42, 43 of the MEMS substrate 40. Temperature is then increased, and while maintaining the anodic bonding temperature, DC voltage is applied in order that the MEMS substrate 40 is higher voltage than the LTCC substrate 45. Consequently, the metal layers 53, 54 melt and form an alloy or an intermetallic compound with the first and the second electrodes 42, 43, whereby generating a first and a second connecting wiring part 51, 52 and electrically connecting the first and the second electrodes 42, 43 and the first and the second lower electrodes 46, 47 respectively. At this time, the opposing surface of the LTCC substrate 45 and that of the MEMS substrate 40 contact each other and bonded. The hatched area shown as A2 in the figure represents the anodically-bonded area.

By executing the above process, the LTCC substrate 45 can cover the MEMS substrate 40, while containing the housing part 50 wherein the MEMS structure 41 is formed on the LTCC substrate 45.

Figure 7:
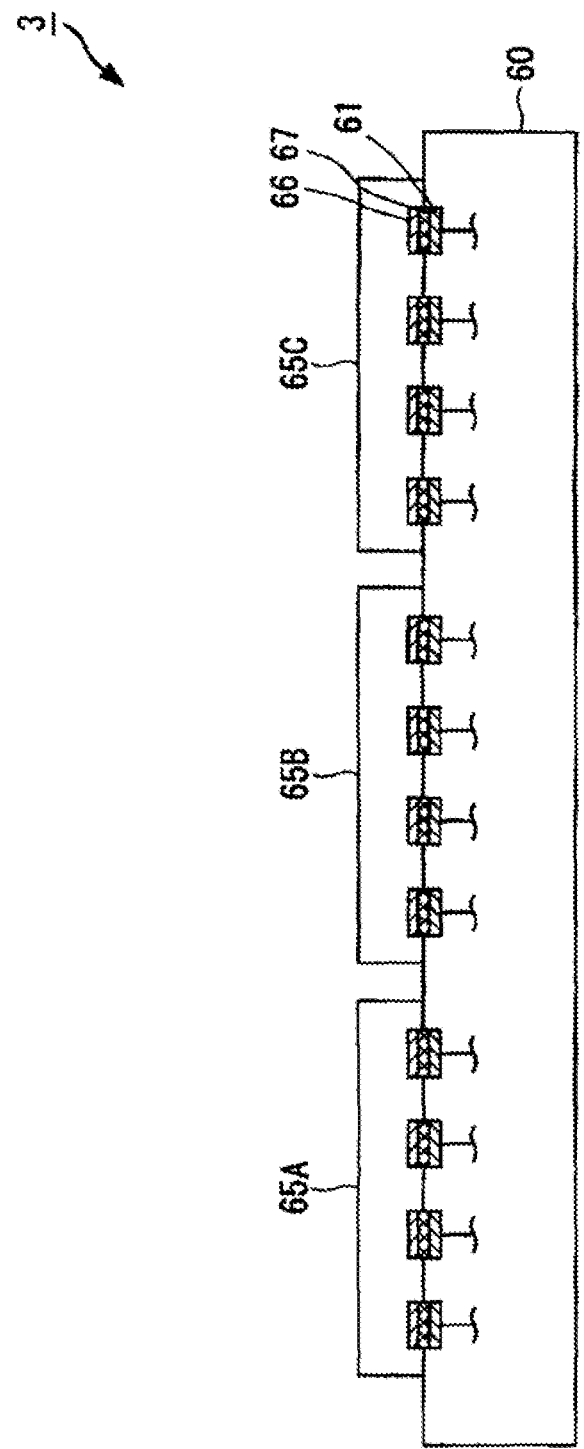
FIG. 7 is a chart illustrating another functional device according to an embodiment of the present invention.
Figure 8:
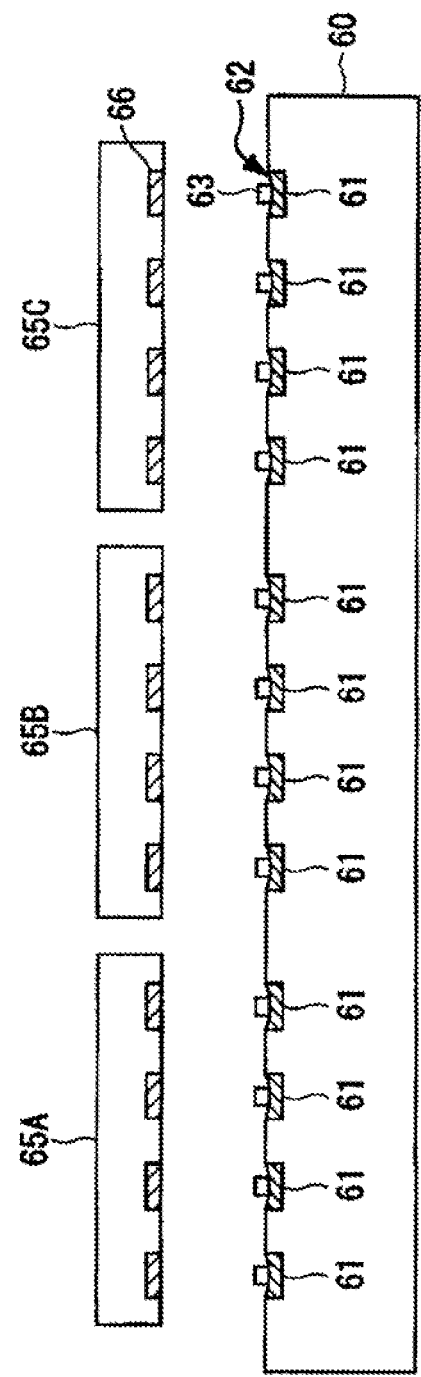
FIG. 8 is a chart illustrating the state before anodic bonding is performed to manufacture the functional device shown in FIG. 7.

Another embodiment will hereinafter be described. FIG. 7 is a cross-sectional view illustrating a functional device 3 according to the embodiment of the present invention. FIG. 8 is a chart illustrating the state before anodic bonding is performed to manufacture the functional device shown in FIG. 7. As shown in FIG. 7, the functional device 3 is structured by anodically bonding various chips 65A, 65B, 65C to the LTCC substrate 60. As chips 65A, 65B, 65C, those manufactured by forming devices on a wafer made of a semiconductor material such as Si by semiconductor process, and then separating it into individual chips by scribing, such as MEMS chips wherein a MEMS structure is formed on a Si substrate and IC chips wherein an integrated circuit is formed on a Si substrate, are included. Connecting electrodes 66 are formed at places on the bottom surface of the chips 65A, 65B, 65C. In this embodiment, the LTCC substrate 60 represents the first substrate, whereas the chips 65A, 65B, 65C represent the second substrate.

The LTCC substrate 60 is formed by laminating printed wiring on a substrate having undergone through wiring for example, in order that the plurality of connecting electrodes 61 are connected by multilayer interconnection, and by firing it while applying pressure from top and bottom for bonding. The plurality of connecting electrodes 61 are arranged, corresponding to each connecting electrode 66 of the plurality of chips 65A, 65B, 65C. At the connecting electrode 61 on the surface of the LTCC substrate 60, recessed space 62 is formed. In that space, a metal layer 63 is formed on each connecting electrode 61 of the LTCC substrate 60. The volume of the metal layer 63 is the same as or smaller than the volume of the space 62, and the thickness of the metal layer 63 is larger than the gap between the connecting electrode 61 of the LTCC substrate 60 and the connecting electrode 66 of the chips 65A, 65B, 65C formed when the LTCC substrate 60 and the chips 65A, 65B, 65C are placed together before the metal layer 63 is formed. In other words, the metal layer 63 in the LTCC substrate 60 protrudes from the opposing face of the LTCC substrate 60.

In this embodiment, the connecting electrodes 66 of the chips 65A, 65B, 65C and the connecting electrodes 61 of the LTCC substrate 60 form an alloy or intermetallic compound with the material of the metal layer 63, generating connecting wiring part 67. Each connecting wiring part 67 electrically connects the chips 65A, 65B, 65C and the LTCC substrate 60.

In this functional device 3, the plurality of chips 65A, 65B, 65C, such as MEMS chips and IC chips, are anodically bonded to the LTCC substrate 60, and connections are established by multilayer interconnection within the LTCC substrate 60. The LTCC substrate 60 is used as an interposer, which achieves various functional devices.

The wiring connection method for manufacturing this functional device 3 will be described below. An LTCC substrate 60 and a plurality of chips 65A, 65B, 65C are prepared. The LTCC substrate 60 has a multilayer interconnection structure, and a plurality of connecting electrodes 61 are formed on its surface. In each connecting electrode 61 of the LTCC substrate 60, a recessed space 62 is formed, and the surface of the connecting electrode 61 is not on the same plane as the bonded surface of the LTCC substrate 60. As shown in FIG. 8, a metal layer 63 is formed for each of the connecting electrodes 61 of the LTCC substrate 60. In this case, the metal layer 63 is formed in order that it does not fill the recessed space 62, has a thickness higher than the height of the gap between the connecting electrode 61 and the connecting electrode 66 formed when the LTCC substrate 60 and the chips 65A, 65B, 65C are placed together in a state where the metal layer 63 shown in FIG. 8 is not formed, and the volume of the metal layer 63 is smaller than the recessed space 62.

As shown in FIG. 8, the chips 65A, 65B, 65C are then made to contact the LTCC substrate 60 in order that each connecting electrode 61 of the LTCC substrate 60 and the connecting electrode 66 of the chips 65A, 65B, 65C face opposite to each other. Temperature is increased, and DC voltage is applied to the LTCC substrate 60 while the anodic bonding temperature is maintained in order that the chips 65A, 65B, 65C is higher voltage than the LTCC substrate 60. Consequently, the metal layer 63 melts, forming an alloy or intermetallic compound with the connecting electrode 66 as connecting wiring part 67, the connecting electrode 61 and the connecting electrode 66 are electrically connected, and at the same time the opposing faces of the LTCC substrate 60 and the chips 65A, 65B, 65C contact each other and bonded.

By undergoing the above process, the plurality of chips can be anodically bonded to one LTCC substrate, establishing wiring connection between the chips.

A specific example of the embodiment of the present invention shown in FIG. 1 will hereinafter be described. An LTCC substrate 10 having through wiring formed with a metal such as Au, is prepared. At this time, by polishing the surface of the LTCC substrate 10, the surface of the through wiring as connecting electrode 12 is recessed by several hundred nm from the surface of the insulating material 11 of the LTCC substrate 10. Insufficient amount of recess, if any, is adjusted by etching. In the LTCC substrate 10, an In pad as the metal layer 14 is then formed on the surface of the through wiring by liftoff. Meanwhile, Cr layer, Pt layer, and Au layer, for example, are formed on the Si substrate 16 in that order to form an electric pad as the connecting electrode 17. In this case, size adjustment is made in order that the recess on the surface of the through wiring, thickness of the In pad, and the thickness of the electrode pad satisfy the relation that the recess on the surface of the through wiring is larger than the sum of the thickness of the In pad and the thickness of the electrode pad.

The position of the LTCC substrate 10 and that of the Si substrate 15 are determined, both are placed together and pressed, and placed into a furnace preheated to a specified temperature. The temperature of the furnace is set to a temperature allowing the In pad to melt or higher, at 200° C. for example. The temperature of the furnace is then increased to 400° C. as anodic bonding temperature for example, the negative electrode of the power supply is connected to the LTCC substrate 10, the positive electrode of the power supply is connected to the Si substrate 15, and voltage of several hundred V is applied between the LTCC substrate 10 and the Si substrate 15 to conduct anodic bonding.

Or, the position of the LTCC substrate 10 and that of the Si substrate 15 are determined, both are placed together and pressed, the substrate pair is placed in a furnace whose temperature has been increased to 400° C. for example as anodic bonding temperature, the LTCC substrate 10 is connected to the negative electrode of the power supply, the Si substrate 15 is connected to the positive electrode of the power supply, DC voltage of several hundred V is applied between the LTCC substrate 10 and the Si substrate 15 to conduct anodic bonding.

Consequently, the In pad melts and mixes with Au to form an intermetallic compound whose melting point is approximately 500° C., establishing electrical connection between the In pad and the electrode pad. Na ions within the LTCC substrate 10 move, drawn to negative pole. Therefore, a positively charged layer is formed in proximity to the bonded surface of the LTCC substrate 10. A so-called space-charge layer where Na ions are lacking are formed in proximity to the bonded surface of the Si substrate 15, and covalent bonding occurs on the bonded surface due to electrostatic attraction, thereby bonding the LTCC substrate 10 and the Si substrate 15.

According to the embodiment of the present invention, even if the thickness of the electrode pad as the connecting electrode on the first substrate side and that of the electrode pad as the connecting electrode on the second substrate side are not controlled strictly, anodic bonding and reliable electrical connection can be simultaneously established.

Further description will hereinafter be provided based on specific examples.

Example 1

FIG. 9 is a chart illustrating the process of wiring connection method used in Example 1. The first substrate 70 and the second substrate 75 were fabricated, following the procedure shown below.

The first substrate 70 was fabricated as follows: a step was formed partially on a Si substrate 71, an oxide film was formed by the CVD method, the oxide film on the surface to be bonded with the second substrate 75 was subjected to wet etching, an electric circuit was formed on the remaining oxide film 72, and a Ti layer 73a and a Cu layer 73b were sequentially formed as connecting electrode 73 so that their respective thickness becomes 100 nm and 600 nm. The surface of the electrode pad as the connecting electrode 73 was made to be lower than the bonded surface by 300 nm.

The second substrate 75 was fabricated as follows: a Cr layer 77a and a Cu layer 77b were sequentially formed as connecting electrode 77 on the through electrode 76a of an LTCC substrate 76, and furthermore a Sn layer was formed as a metal layer 78. The thickness of the Cr layer 77a was made to be 100 nm, whereas the thickness of the Cu layer 77b was made to be 500 nm. The height of the Sn layer as the metal layer 78 from the bonded surface of the LTCC substrate 76 was made to be 600 nm.

A K-type thermocouple having wire diameter of 0.3 mm was attached respectively to the Si substrate 71 and the LTCC substrate 76, and sample temperature was measured while the process was executed.

The bonding system used is structured to have three chambers, namely a pretreatment chamber, positioning chamber, and bonding chamber, and is equipped with a mechanism for sequentially transferring a stage from the pretreatment chamber to the positioning chamber, and then to the bonding chamber. By transferring samples to the preheated bonding chamber by this mechanism, sample temperature can be increased quickly. In addition, in the pretreatment chamber, treatment can be performed in a formic acid atmosphere, for example, while the chamber is heated. The pretreatment chamber is separated from the positioning chamber and the bonding chamber with partition walls, and equipped with an independent vacuum system. This bonding system is structured to allow every processing to be executed sequentially under high vacuum.

As a process to be conducted before bonding the first substrate 70 and the second substrate 75, the oxide film on the surface of the metal may be removed by exposing the heated sample to formic acid vapor. This process is executed as required depending on the material of the metal.

Figure 10:
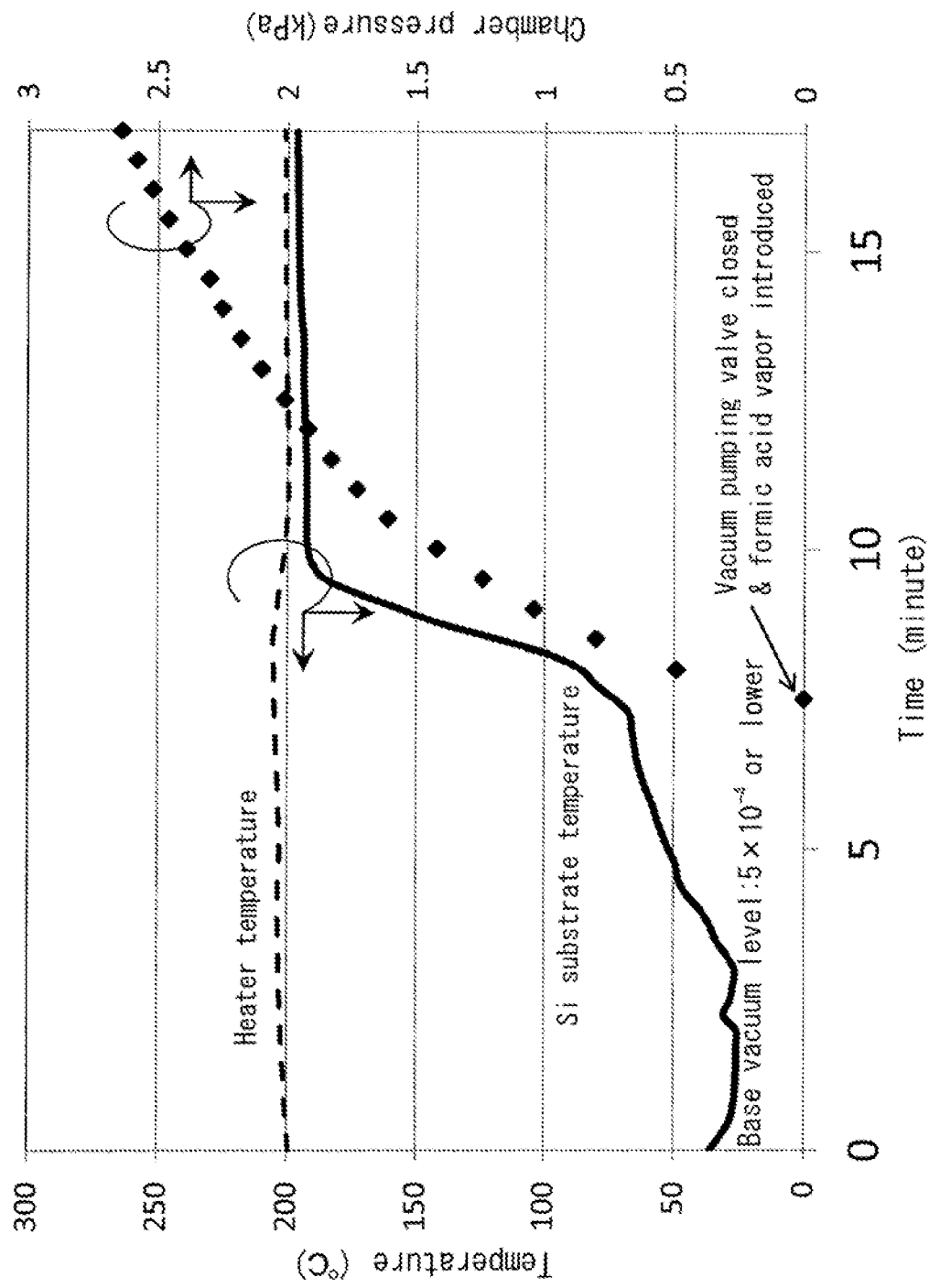
FIG. 10 is a chart showing the temperature transition exhibited when a dummy Si substrate was treated with formic acid vapor to define conditions for pretreatment.

A test was conducted to set the conditions for pretreatment. FIG. 10 is a chart showing temperature transition exhibited when the Si substrate was treated with formic acid vapor. The horizontal axis represents time (minute), the left vertical axis represents temperature (° C.), and the right vertical axis represents the chamber pressure (kPa) of the pretreatment chamber. The heater temperature in the pretreatment chamber was maintained at 200° C. as shown by the bold dotted line, and after highly evacuated state was maintained for 7.5 minutes, the vacuum pumping valve was closed and formic acid vapor was introduced. As a result, as shown by the diamond plots (◆), the chamber pressure became 1.5 kPa in approximately 3 minutes after the vacuum pumping valve was closed, and the temperature of the Si substrate as a dummy reached 198° C. as shown by the solid line.

From these results, the pretreatment conditions were set as follows: the formic acid vapor pressure for pretreatment was set at 2 kPa, the treatment temperature at 250° C., and treatment time at a duration of five minutes after the treatment pressure was reached. Note that the melting point of Sn is 232° C. It is only necessary to conduct treatment by formic acid at 150° C. or higher. The temperature was set at 250° C. to increase the temperature of Sn to its melting point or higher once, thus smoothing the surface by reflow effect. It has been confirmed that even if the treatment is conducted at 150° C. or higher, anodic bonding or wiring connection are not affected.

Figure 11:
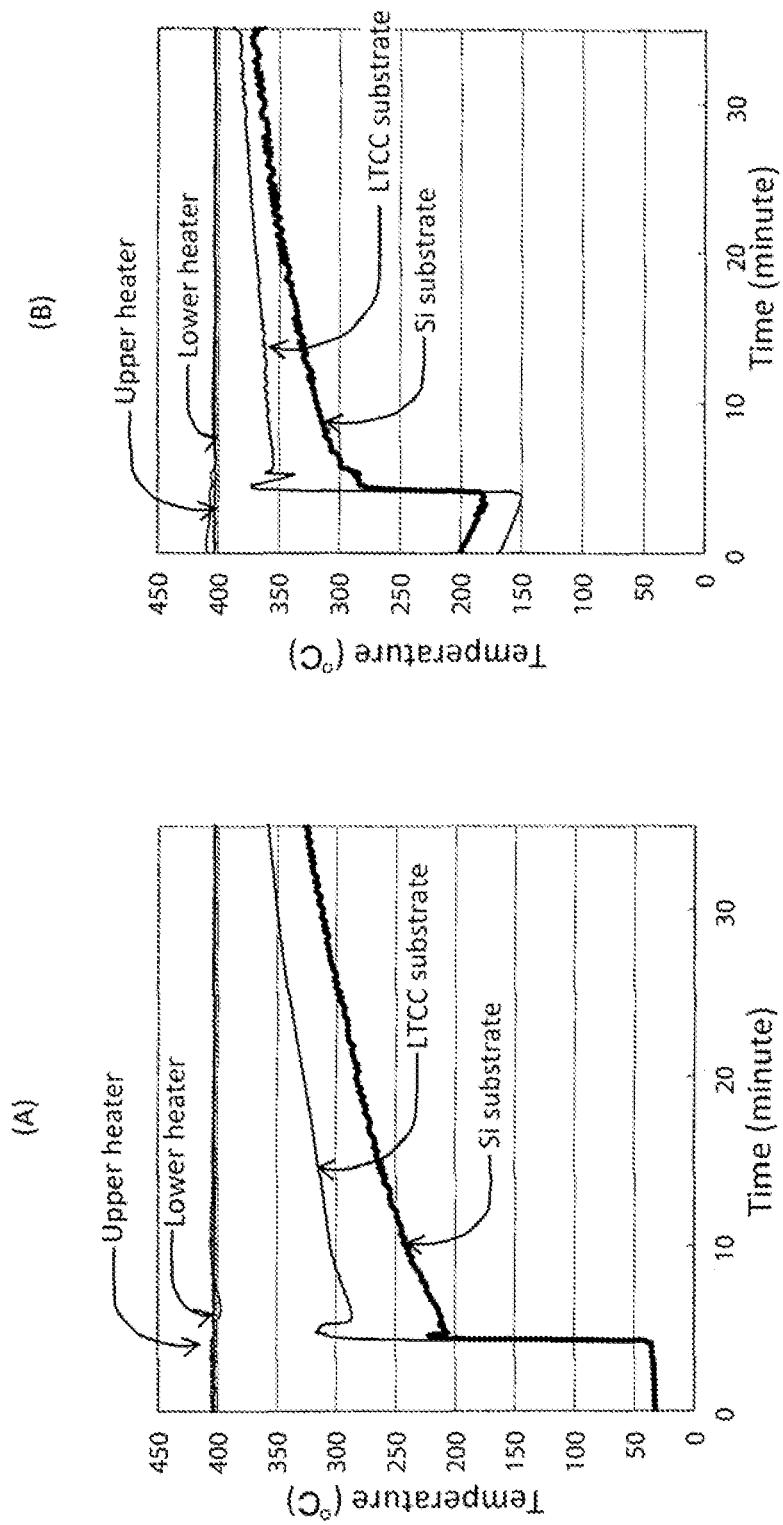
FIG. 11 is a chart illustrating the temperature transition exhibited when a Si substrate and a glass substrate were placed together to define conditions for bonding, where (A) is a case where the stage was at normal temperature, and (B) is a case where the stage was heated.

A test was then conducted to set the conditions for bonding. A Si substrate and an LTCC substrate as dummies were placed together, they were placed on a stage, and the stage was brought into the bonding chamber with the heater temperature maintained at 400° C. FIG. 11 presents charts showing the temperature transition of the Si substrate and the LTCC substrate to set bonding conditions, in which (A) is a case where the stage is maintained at normal temperature, and (B) is a case where the stage is heated to 400° C.

Temperature transition of the case where the stage was maintained at a normal temperature and that of the case where the stage was heated to 400° C. were compared. When the stage was at a normal temperature, the temperature of the upper LTCC substrate and the lower Si substrate as dummies immediately after transportation respectively increased to 300° C. and 200° C. Meanwhile, when the stage was heated to 400° C., the temperature of the upper LTCC substrate and the lower Si substrate as dummies immediately after transportation respectively increased to 350° C. and 280° C., and then the temperature of both of them further increased at the rate of 5° C./minute.

From the above, to establish electrical connection, heating the stage before transporting the sample was included in bonding conditions, and the chamber temperature was set at 350° C.

Under these conditions, an anodic bonding test of a borosilicate glass substrate and a Si substrate was conducted, and it was confirmed that by applying 500 V voltage for five minutes at 350° C. setting, favorable bonding can be conducted.

From the results described above, bonding conditions were set as follows: the first substrate 70 and the second substrate 75 are brought into the positioning chamber and the bonding chamber using the preheated stage, they are pressed at 2 MPa in a state where the first substrate 70 and the second substrate 75 are tightly attached to each other, and DC voltage of 500 V is applied between the first substrate 70 and the second substrate 75 for 10 minutes.

Under the above pretreatment conditions, pretreatment was conducted in the pretreatment chamber, the first substrate 70 and the second substrate 75 were then positioned with respect to each other in the positioning chamber, they were brought into the bonding chamber preheated to 350° C. placed on the heated stage, and anodic bonding was conducted.

Example 2

The conditions of Example 2 were the same as Example 1 except that the height of the Sn layer as the metal layer 78 from the bonded surface of the LTCC substrate 76 was set at 1000 nm.

Comparative Example

The conditions of Comparative Example were the same as Example 1 except that the Sn layer as the metal layer 78 was not protruding from the bonded surface of the LTCC substrate 76.

Figure 12:
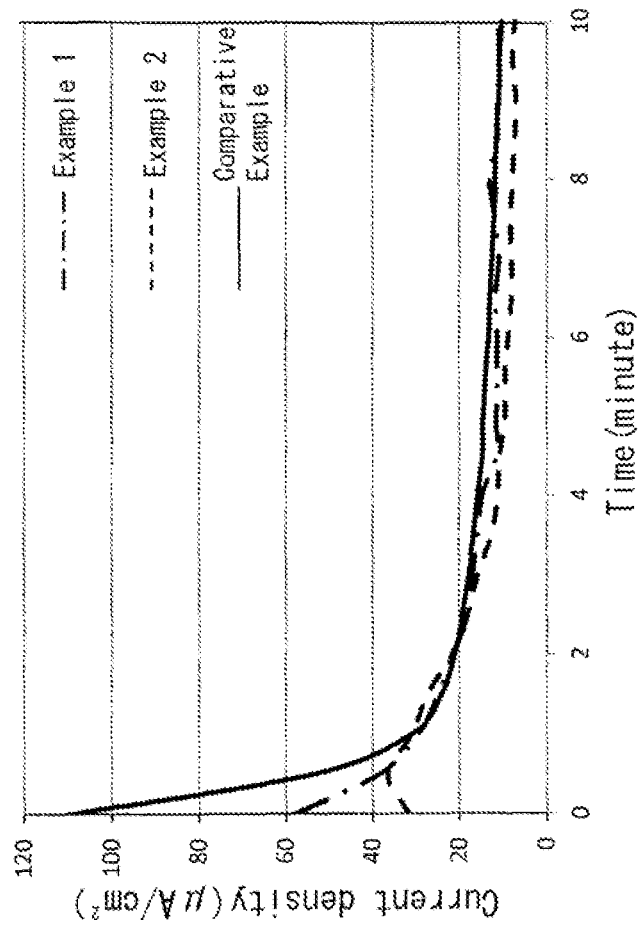
FIG. 12 is a chart showing the change in current density with time in Examples 1 and 2 and Comparative Example.
Figure 13:
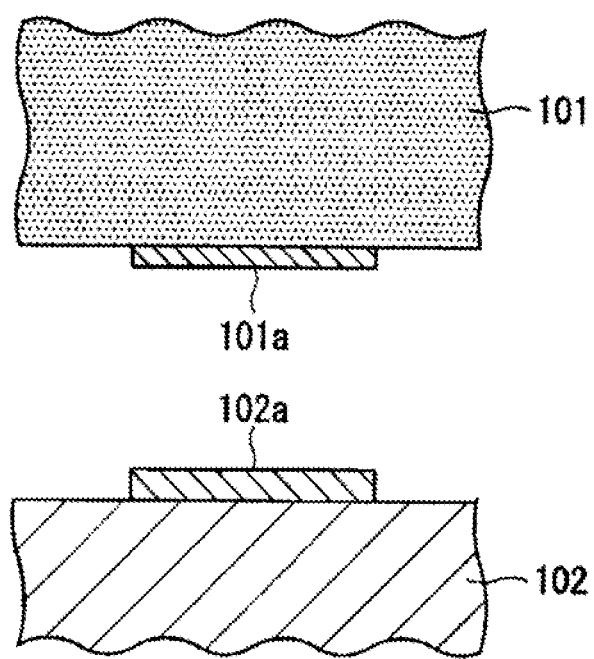
FIG. 13 is a chart illustrating one of the problems to be solved by the present invention.
Figure 14:
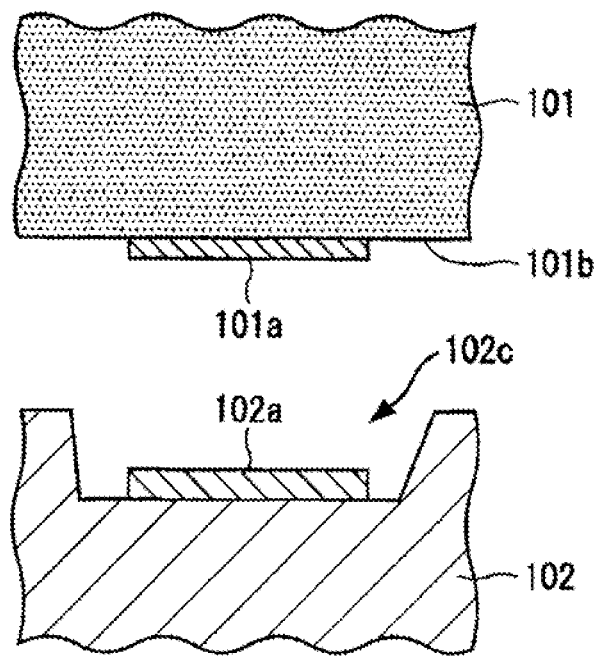
FIG. 14 is a chart illustrating another problem to be solved by the present invention.
Figure 15:
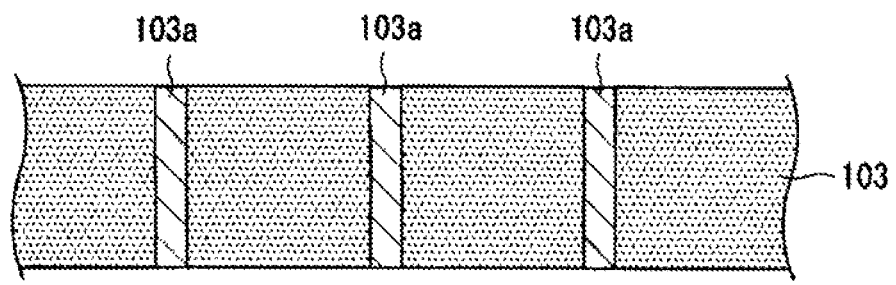
FIG. 15 is a chart illustrating a substrate with through wiring as an example for describing a problem to be solved by the present invention.
Figure 16:
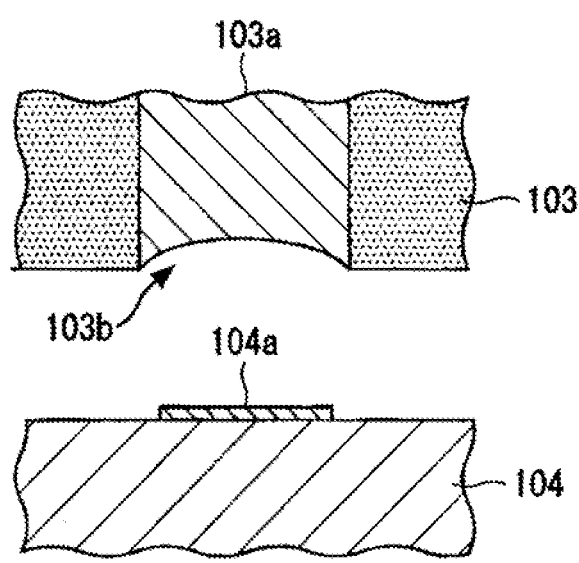
FIG. 16 is a chart illustrating another problem to be solved by the present invention.

The results of Example 1, Example 2, and Comparative Example will be described below. FIG. 12 is a chart showing the change in current density with time. The horizontal axis represents time (minute) and the vertical axis represents current density ($\mu A/cm^2$). The dot-dash line, dotted line, and solid line respectively represent the result of Example 1, Example 2, and Comparative Example. In any of these cases, when DC voltage was applied between the first substrate 70 and the second substrate 75, anodic bonding progressed with time, and junction current density decreased. The lower the height of the protrusion was, or if there was no protrusion, the larger the decrease in current density was.

Table 1 shows the connection state of the connecting electrode 79, and bonding state of the substrates to each other in Example 1, Example 2, and Comparative Example. The circle (◯) in the table represents Good, whereas the cross (x) represents NG. By maintaining the height of protrusion of the electrodes from the bonded surface of the LTCC substrate 76 at 600 nm and 1000 nm, good anodic bonding was achieved between the substrates and good electrode connection was established. Meanwhile in Comparative Example, although good anodic bonding was achieved between the substrates, no electrode connection was established.

TABLE 1

| | Height of protrusion (nm) | Result | |
|---|---|---|---|
| | | Anodic bonding | Electrical connection |
| Example 1 | 600 | ◯ | ◯ |
| Example 2 | 1000 | ◯ | ◯ |
| Comparative Example | 0 | ◯ | x |

From the above, it was found that anodic bonding and electrode connection can be simultaneously achieved, on condition that the height of the protrusion from the second substrate 75, namely the sum of the height of the connecting electrode 77 and the height of the metal layer 78, falls within the range from two to three times the depth from the bonded surface of the first substrate 70 to the connecting electrode 73.

Although DC voltage is applied between the first substrate and the second substrate for anodic bonding, current does not flow into the electric circuit of the MEMS via the through wiring because a dummy glass substrate is placed on the LTCC substrate having through electrode, and the DC current is applied via the dummy glass substrate. Consequently, the MEMS is never damaged by anodic bonding, which requires application of high voltage.

As described by referring to the embodiments and examples of the present invention, by forming connecting wiring parts and metal layers in a combination capable of forming an intermetallic compound or alloy, and applying DC voltage between the first substrate and the second substrate at anodic bonding temperature, the substrates can be anodically bonded and at the same time electrical connection can be established by connecting the connecting electrode to each other via the connecting wiring part. According to the present invention, there is no need to control the height of the connecting pad made of a metal having low melting-point or perform additional processing of the substrate on which a MEMS has been formed. The present invention is effective for highly versatile wafer-level hermetic packaging.

What is claimed is:

1. A wiring connection method, comprising:
   forming a metal layer on at least one of a connecting electrode of a first substrate and a connecting electrode of a second substrate;
   placing the first substrate and the second substrate together in order that the connecting electrode of the first substrate and the connecting electrode of the second substrate face each other via the metal layer;
   increasing temperature to an anodic bonding temperature; and
   applying DC voltage to the first substrate and the second substrate while maintaining the temperature to anodically bond the first substrate and the second substrate and to melt the metal layer,
   wherein an alloy and/or an intermetallic compound, which does not melt at temperatures the same as or lower than the anodically bonding temperature, is formed between the metal layer and the connecting electrode of the first substrate, and/or, between the metal layer,
   the connecting electrode of the first substrate and the connecting electrode of the second substrate do not contact but form a space when the first substrate and the second substrate are placed together in a stage before the metal layer is formed, and the metal layer protrudes either from the first substrate or from the second substrate, on which the metal layer is formed, and has a size equal to or smaller than the volume of the space; and
   the metal layer is made of a metal that forms at least an intermetallic compound or at least an alloy between the connecting electrode of the first substrate and the connecting electrode of the second substrate when melted at the anodic bonding temperature, and the melting temperature of the intermetallic compound or the alloy is higher than the melting temperature of the metal layer as a single body,
   whereby the connecting electrode of the first substrate and the connecting electrode of the second substrate are electrically connected, and
   wherein the combination of materials for at least one of the connecting electrode of the first substrate and the connecting electrode of the second electrode and for the metal layer is one of Sn—Cu, Sn—Ag, In—Ag, Sn—Au, In—Au, Sn—Ni, and Sn—In.

2. The wiring connection method as set forth in claim 1, wherein either the first substrate or the second substrate is a glass substrate or low temperature co-fired ceramic (LTCC) substrate.

3. The wiring connection method as set forth in claim 2, wherein the LTCC substrate has through wiring or internal wiring made of a gold-system alloy.

4. The wiring connection method as set forth in claim 1, wherein through wiring or internal wiring is formed on at least one of the first substrate and the second substrate.

5. The wiring connection method as set forth in claim 1, wherein at least one of the first substrate and the second substrate is a chip where electronic circuits and Micro Electronic Mechanical Systems (MEMS) are formed.

6. The wiring connection method as set forth in claim 1, wherein an internal space is formed and hermetically sealed with the first substrate and the second substrate.

\* \* \* \* \*